(12) United States Patent
Taga et al.

(10) Patent No.: US 7,311,241 B2
(45) Date of Patent: Dec. 25, 2007

(54) METHOD OF MOUNTING TERMINAL ON PRINTED BOARD, TERMINAL MOUNTED PRINTED BOARD AND ELECTRIC CONNECTION BOX ACCOMMODATING THE TERMINAL MOUNTED PRINTED BOARD, WHICH ARE FORMED BY THE METHOD

(75) Inventors: Shunji Taga, Mie (JP); Kazuhiro Nakanishi, Osaka (JP)

(73) Assignees: Sumitomo Wiring Systems, Ltd., Mie (JP); Daihatsu Motor Co., Ltd., Osaka (JP)

( * ) Notice: Subject to any disclaimer, the term of this patent is extended or adjusted under 35 U.S.C. 154(b) by 37 days.

(21) Appl. No.: 11/206,181

(22) Filed: Aug. 18, 2005

(65) Prior Publication Data

US 2006/0040517 A1 Feb. 23, 2006

(30) Foreign Application Priority Data

Aug. 19, 2004 (JP) ............................ P2004-239085

(51) Int. Cl.
*B23K 31/02* (2006.01)
*H05K 3/34* (2006.01)

(52) U.S. Cl. .................... 228/180.1; 228/260; 228/261

(58) Field of Classification Search ................ 228/260, 228/261, 180.1, 179.1, 123.1; 439/65
See application file for complete search history.

(56) References Cited

U.S. PATENT DOCUMENTS

| | | | | |
|---|---|---|---|---|
| 4,462,534 A | * | 7/1984 | Bitaillou et al. | 228/180.1 |
| 4,551,914 A | * | 11/1985 | Stiggelbout | 29/837 |
| 5,024,366 A | * | 6/1991 | Kim | 228/56.1 |
| 5,076,796 A | * | 12/1991 | Kusayanagi et al. | 439/83 |
| 5,092,035 A | * | 3/1992 | McMichen et al. | 29/845 |
| 5,270,903 A | * | 12/1993 | McMichen et al. | 361/760 |
| 5,279,028 A | * | 1/1994 | McKee et al. | 29/843 |
| 6,305,596 B1 | * | 10/2001 | Lin et al. | 228/125 |
| 6,915,941 B2 | * | 7/2005 | Takaguchi et al. | 228/180.1 |
| 6,976,855 B2 | * | 12/2005 | Kennedy et al. | 439/83 |
| 2002/0110636 A1 | * | 8/2002 | Tombs et al. | 427/96 |
| 2004/0209495 A1 | * | 10/2004 | Kennedy et al. | 439/78 |

FOREIGN PATENT DOCUMENTS

| | | |
|---|---|---|
| JP | A 9-074261 | 3/1997 |
| JP | A 9-186475 | 7/1997 |
| JP | A 10-164730 | 6/1998 |
| JP | A 11-178161 | 7/1999 |
| JP | A 2000-21516 | 1/2000 |
| JP | A 2004-31540 | 1/2004 |

* cited by examiner

*Primary Examiner*—Kiley Stoner
(74) *Attorney, Agent, or Firm*—Oliff & Berridge, PLC

(57) ABSTRACT

A printed board is arranged above solder blowing nozzles of a spot flow soldering apparatus with first terminal groups facing upward, second terminal groups projected toward the solder blowing nozzles are shielded by shield jigs, solder jetted from the solder blowing nozzles solders soldered portion of the first terminal groups to a first conductor on a back side of the printed board, then the printed board is turned upside down to put the second terminal groups in an upward facing state and to use a jig to shield the first terminal groups facing downward, and solder jetted from the solder blowing nozzles solders soldered portion of the second terminal groups to a second conductor on a front side of the printed board.

2 Claims, 9 Drawing Sheets

METHOD OF MOUNTING TERMINAL ON PRINTED BOARD, TERMINAL MOUNTED PRINTED BOARD AND ELECTRIC CONNECTION BOX ACCOMMODATING THE TERMINAL MOUNTED PRINTED BOARD, WHICH ARE FORMED BY THE METHOD

BACKGROUND OF THE INVENTION

1. Field of the Invention

The present invention relates to a method of mounting a terminal on a printed board, a terminal mounted printed board and an electric connection box accommodating the terminal mounted printed board, which are formed by the method, and more particular, to mounting terminals at narrow pitches on front and back sides of a printed board.

2. Description of the Related Art

Some electric connection boxes mounted on an automobile use, as an internal circuit, an terminal mounted printed board having a plurality of pin terminals mounted on a printed board.

JP-A-9-186475 filed by the applicant of the present application provides an electric connection box 1 shown in FIGS. 9A, 9B. The electric connection box 1 accommodates a terminal mounted printed board 4 in a casing composed of an upper casing 2 and a lower casing 3, and all terminals 6 soldered to a printed board 5 are projected only from a surface 5a of the printed board 5 to project into a connector accommodation part 2a provided in the upper casing 2.

The terminal mounted printed board 4 in the electric connection box 1 provided by JP-A-9-186475 involves one-side mounting and so can be readily formed by reflow soldering, but involves a problem that freedom in circuit wiring is low and a board becomes large in size when a circuit pattern is complicated.

Also, JP-A-9-74261 provides a terminal mounted printed board 9, in which terminals 8 project from both front and back sides of a printed board 7 provided on both sides of a board 7a with a printed circuit 7b. When the terminals 8 project from both sides of the board 7a, reflow soldering is not possible, so that spot flow soldering is generally performed by a solder blowing nozzle. With such spot flow soldering, when a terminal 8A projecting from a front surface 7a-1 of the board 7a and a terminal 8B projecting from a back surface 7a-2 are arranged at a narrow pitch, solder H is blown against the both terminals 8A, 8B, so that the terminals 8A, 8B conduct each other. Therefore, in the case where it is necessary to insulate the terminals 8A, 8B from each other, there is a need of providing a necessary spacing between the terminals 8A, 8B, thus causing a problem that mounting at a narrow pitch is not possible and the board becomes large in size.

SUMMARY OF THE INVENTION

It is an object to provide a terminal mounted printed board, in which terminals projected from a front side of a printed board and terminals projected from a back side are mounted at narrow pitches and which is high in freedom of circuit wiring and made small in size, and an electric connection box accommodating therein the terminal mounted printed board.

According to one aspect of the invention, there is provided a method of mounting a terminal on a printed board, the method including: preparing a printed board having a terminal hole and a conductor having a first conductor provided on a back side of the printed board and a second conductor provided on a front side of the printed board; inserting a terminal having a first terminal group and a second terminal group into the terminal hole of the printed board from the front and back sides of the printed board; retaining and fitting the terminal into the terminal hole of the printed board, while a soldering portion of the terminal is projected from the terminal hole; assembling the terminal in a state, in which the first terminal group of the terminal is projected from the front side of the printed board and the second terminal group of the terminal is projected from the back side of the printed board;

subsequently, arranging the printed board above a solder blowing nozzle of a spot flow soldering apparatus with the first terminal group facing upward; shielding the second terminal group projected toward the solder blowing nozzle with a jig; soldering the soldered portion of the first terminal group to the first conductor provided on the back side of the printed board by solder jetted from the solder blowing nozzle; subsequently turning the printed board upside down to make the second group terminal face upward; shielding the first terminal group facing downward with the jig; and soldering the soldered portion of the second terminal group to the second conductor on the front side of the printed board by solder jetted from the solder blowing nozzle.

With the construction, when the solder blowing nozzle jets solder against the soldered portions of the first terminal group to solder the first terminal group to the printed board, the second terminal group is projected in opposition to a direction, in which the first terminal group is projected, that is, a side, on which the solder blowing nozzle is arranged, while the jig is arranged in a manner to surround the second terminal group to shield the same from the solder blowing nozzle. Therefore, even when the second terminal group is arranged in a position close to the first terminal group, solder is not jetted against projected portions of the second terminal group.

When the second terminal group is soldered to the printed board, solder is not jetted against projected portions of the first terminal group since the jig shields the first terminal group projected toward a side, on which the solder blowing nozzle is arranged.

As described above, it is possible to form a terminal mounted printed board, on which the first terminal group projected from the front side of the printed board and the second terminal group projected from the back side can be mounted at narrow pitches, and which is high in freedom of circuit wiring and made small in size.

According to another aspect of the invention, the above-method further including: simultaneously blowing solder against the soldered portion of the first terminal group from the solder blowing nozzle of the spot flow soldering apparatus; turning the printed board upside down; and simultaneously blowing solder against the soldered portion of the second terminal group.

More specifically, a plurality of first terminal groups and a plurality of second terminal groups, respectively, are held at predetermined spacings on the printed board, and when the first terminal groups are to be soldered to the printed board, the solder blowing nozzle is arranged in a position in opposition to soldered portions of all the first terminal groups and solder is jetted simultaneously from the solder blowing nozzle to mount all the first terminal groups on the printed board collectively. Likewise, solder is jetted simultaneously against soldered portions of all the second terminal groups to mount the second terminal groups on the printed board collectively.

In this manner, the first terminal groups projected from the front side of the printed board and the second terminal groups projected from the back side are mounted on the printed board in the solder blowing work twice to enable forming a terminal mounted printed board.

According to another aspect of the invention, there is provided with a terminal mounted printed board including a printed board formed by the above-method.

According to another aspect of the invention, a terminal mounted to the printed board is a connector terminal. The connector terminal is provided to project from the front and back sides of the printed board in an aligned state at predetermined pitches in lengthwise and crosswise directions.

According to another aspect of the invention, the connector terminals are aligned in two rows a connector terminal group. The connector terminal group is projected from terminal holes of a connector accommodation portion. The connector terminal group is provided in plural sets in a transverse or/and longitudinal direction. The connector terminal group comprises a first connector terminal group projected from a front side of the printed board and a second connector terminal group projected from a back side. The first connector terminal group and the second connector group are alternately provided.

As described above, when one terminal group is projected into one connector accommodation part, predetermined spacing is defined between the first terminal groups and between the second terminal groups. Since the second terminal groups are mounted in spaces defined between the first terminal groups and the first terminal groups are mounted in spaces defined between the second terminal groups, no waste space is generated on the printed board and a terminal mounted printed board can be made small in size.

According to another aspect of the invention, the terminal is substantially formed in pin shape. A pitch between terminals in the connector terminal group is 2 mm to 4 mm. A pitch between adjacent terminals in the connector terminal groups is 5 mm to 10 mm.

A pitch between terminals in adjacent connector terminal groups, that is, a pitch between the first terminal group and the second terminal group, which are adjacent to each other, can be made as small as 5 mm to 10 mm.

In addition, a pitch between terminals indicates a spacing between central axes of terminals.

The terminals are in the form of a pin, for example, a square pin and a round pin, and it is preferable that the square pin have a rectangular-shaped cross section perpendicular to an axial direction to have one side of 0.64 mm and the round pin have a diameter of 1.0 mm or less.

According to another aspect of the invention, the conductor on the front and back sides of the printed board, which is solder-connected to the terminal, is formed in a predetermined circuit pattern.

With the construction, terminals in different terminal groups can be connected together through conductors on the printed board to be able to accommodate a complicated circuit pattern.

Also, since only exchange of a printed board makes it possible to form a different circuit pattern, various circuit patterns can be formed without changing the spot flow soldering apparatus and mounted terminals, thus enabling reduction in manufacturing cost.

According to another aspect of the invention, an electric connection box including: the terminal mounted printed board formed by the above-aspects.

According to another aspect of the invention, the one printed board has a plurality of the connector terminal groups projected from the front and back side of the one printed board. The one printed board is accommodated in upper and lower casings. A connector accommodation portion having a terminal hole from which the connector terminal groups are projected is aligned. The terminal hole of the connector accommodation portion is sized to permit the terminal to be loosely fitted thereinto.

With the construction, since the electric connection box includes connector accommodation portion provided on upper and lower surfaces of the casing, it can be made small in size as compared with an electric connection box, which comprises connector accommodation portions provided only on one surface of a casing.

While the first terminal groups projected from the front side of the printed board are projected into the connector accommodation portions of the upper casing, the second terminal groups projected from the back side of the printed board are projected into the connector accommodation portions of the lower casing.

Also, since the terminal holes of the connector accommodation portions are sized to permit the terminal on the terminal mounted printed board to be loosely fitted thereinto, the work of insertion of the terminals can be facilitated, and the terminals do not abut against peripheral edges of the terminal holes even when relative positions of the terminals mounted to the printed board and the terminal holes are shifted by a difference in coefficient of thermal expansion (coefficient of contraction) caused by temperature changes of the casings and the printed board. Therefore, it is possible to prevent generation of crack in solder, which would be resulted from application of pressure on soldered portions when the terminals abut against the peripheral edges of the terminal holes.

According to another aspect of the invention, a rib is protrusively provided on inner surface of the casing to surround the terminal hole of the connector accommodation portion. A tip end of the rib is caused to abut against the printed board accommodated in the upper and lower casings.

With the construction, the rib surrounding the terminal holes are caused to abut against the printed board whereby sides of the terminal holes toward an interior of the casings are closed by the ribs and the printed board. Therefore, it is possible to prevent foreign matters from entering into the casings from gaps between the terminal holes and the terminals.

According to the above-aspects of the invention, when terminals being projected from the front and back sides of the printed board are mounted by spot flow soldering, the first terminal groups or the second terminal groups projected toward the solder blowing nozzle is shielded by a jig, so that even when the terminal groups are arranged in the vicinity of the solder blowing nozzle, solder can be prevented from being jetted against projected portions of the terminals. Therefore, a mount work can be performed in a state, in which one of the terminal groups, against which the solder blowing nozzle jets solder to achieve soldering, and the other of the terminal groups projected toward the solder blowing nozzle are arranged in close positions, whereby it is possible to form a terminal mounted printed board, on which the first terminal groups projected from the front side of the printed board and the second terminal groups projected from the back side are mounted at narrow pitches, so that the terminal mounted printed board can be made small in size and high in freedom of circuit wiring.

By accommodating the terminal mounted printed board as an internal circuit in the upper and lower casings and projecting the first terminal groups and the second terminal groups into the connector accommodation portions provided on the casing outer surfaces to make the same a connector terminal group, it is possible to form an electric connection box, which is small in size and lightweight and in which the connector accommodation portions are provided on both upper and lower surfaces of the casings.

DESCRIPTION OF THE PREFERRED EMBODIMENTS

Figure 1:
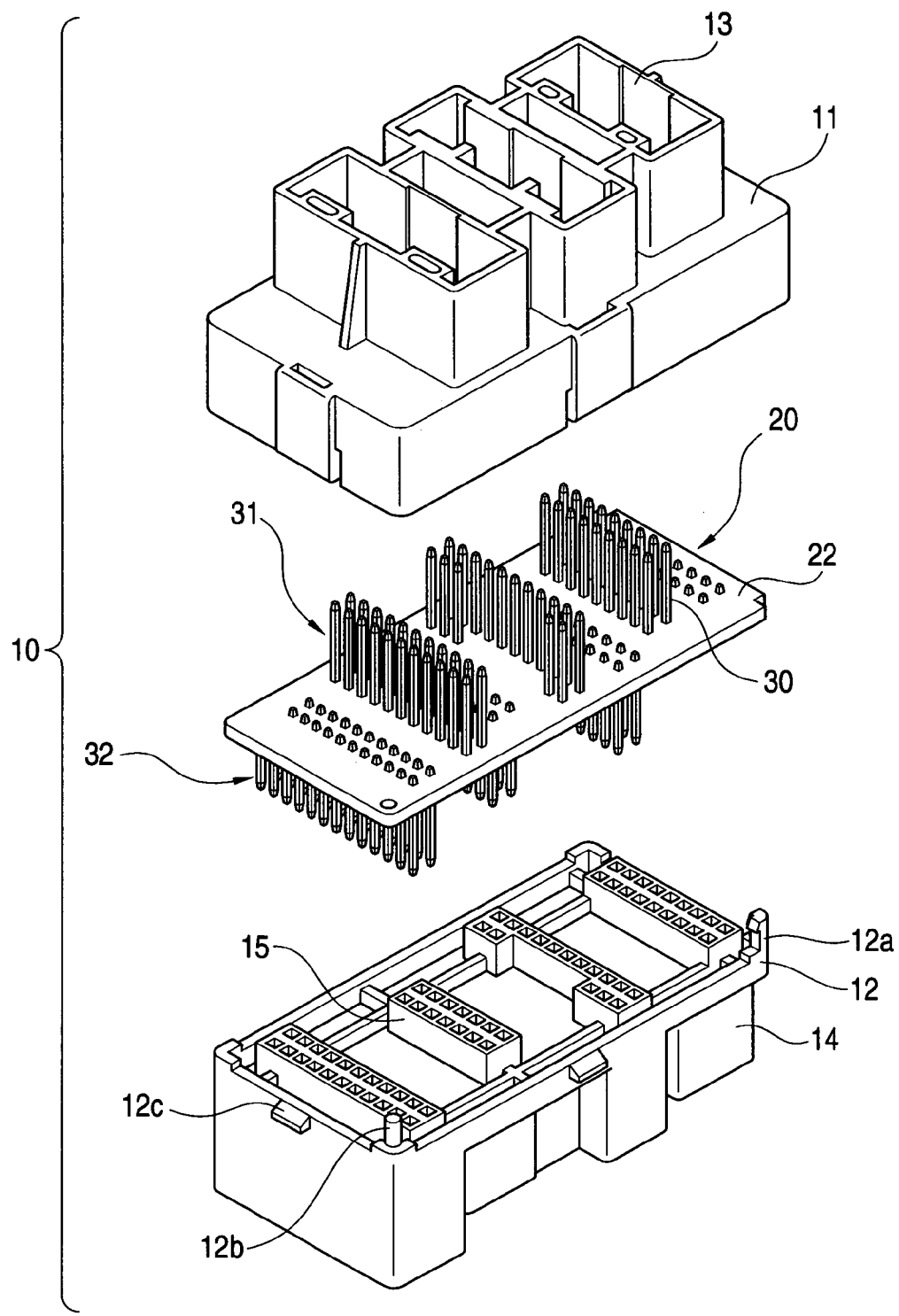
FIG. 1 is an exploded, perspective view showing an electric connection box according to a first embodiment of the invention.
Figure 2:
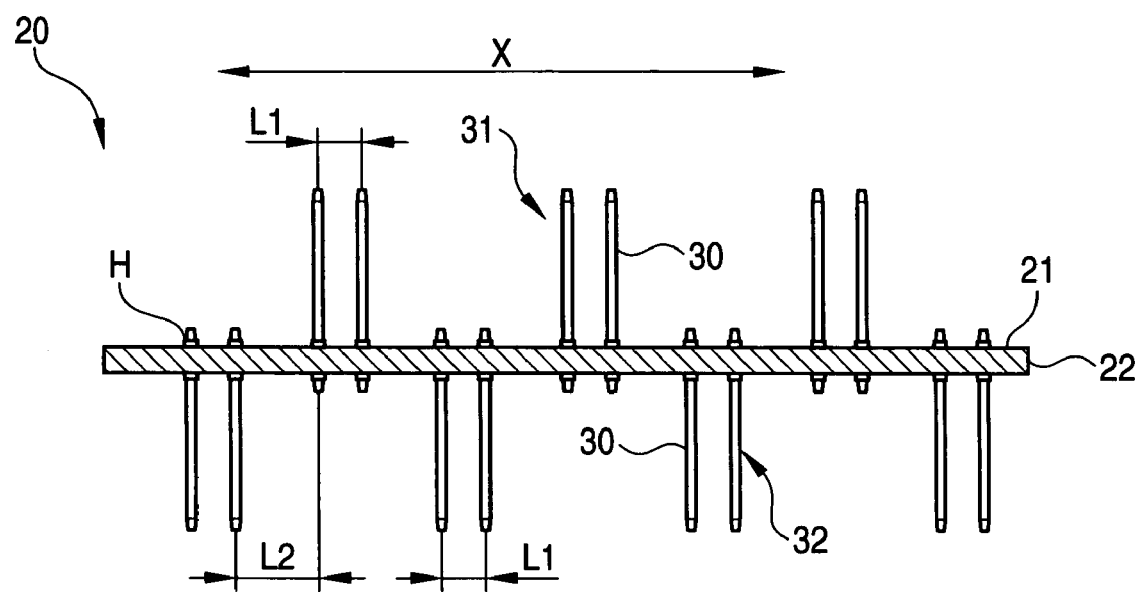
FIG. 2 is a front view showing a terminal mounted printed board.

Embodiments of the invention will be described with reference to the drawings.

FIGS. 1 to 7B show a first embodiment of the invention, in which an electric connection box 10 accommodates a terminal mounted printed board 20 having terminals 30 projecting from both front and back sides thereof into a casing composed of an upper casing 11 and a lower casing 12.

The terminal mounted printed board 20 comprises a printed board 21, first terminal groups 31 having a plurality of terminals 30 from a front side of the printed board 21 and soldered thereto, and second terminal groups 32 having a plurality of terminals 30 from a back side of the printed board 21 and soldered thereto. According to the embodiment, three sets of the first terminal groups 31 and four sets of the second terminal groups 32 are provided, and the first terminal groups 31 and the second terminal groups 32 are provided alternately in a left and right, transverse direction X.

The printed board 21 comprises a conductor 23 (a first conductor 23A on the back side, and a second conductor 23B on the front side) formed from a copper foil having a thickness of 70 micrometer and provided in necessary circuit patterns on both sides of a rectangular-shaped board 22, and an insulating protective layer (not shown) covers an outer surface of the conductor 23 to insulate and protect the conductor 23.

The printed board 21 is provided in necessary locations thereof with terminal holes 24, which extend through the rectangular-shaped board 22, the conductor 23, and the insulating protective layer, and the terminal holes 24 are provided and aligned in two rows (partially, one row) in the left and right, transverse direction X and in a front and rear, longitudinal direction Y. The terminal holes 24 have a diameter of 0.8 mm.

Figure 3A:
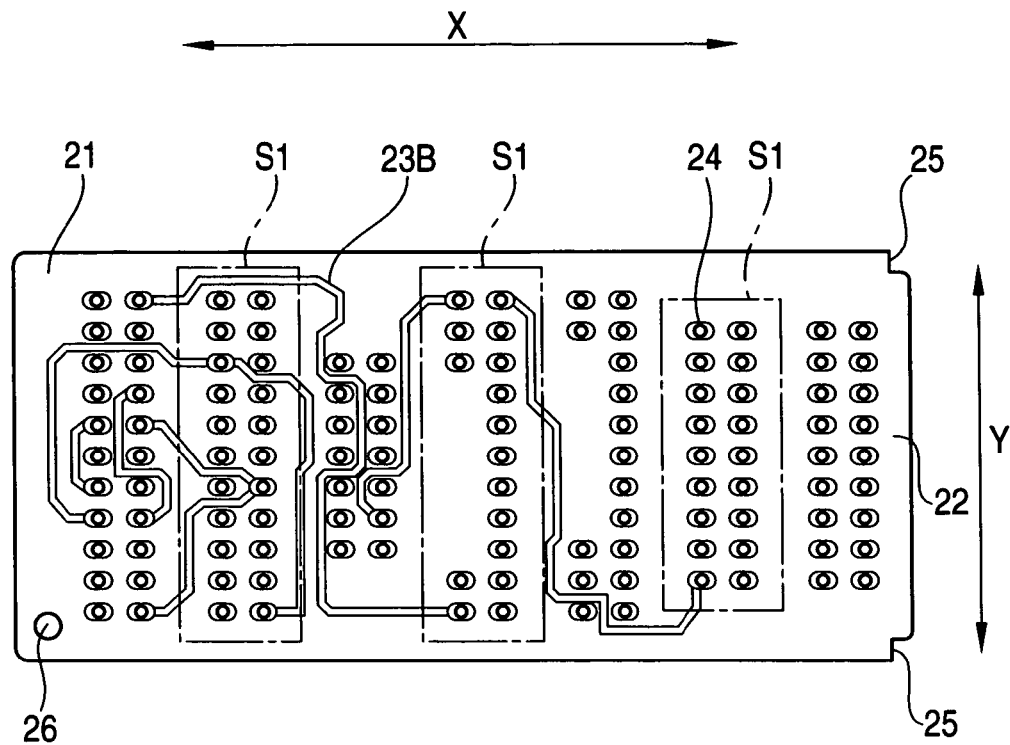
FIG. 3A is a plan view showing the printed board.
Figure 3B:
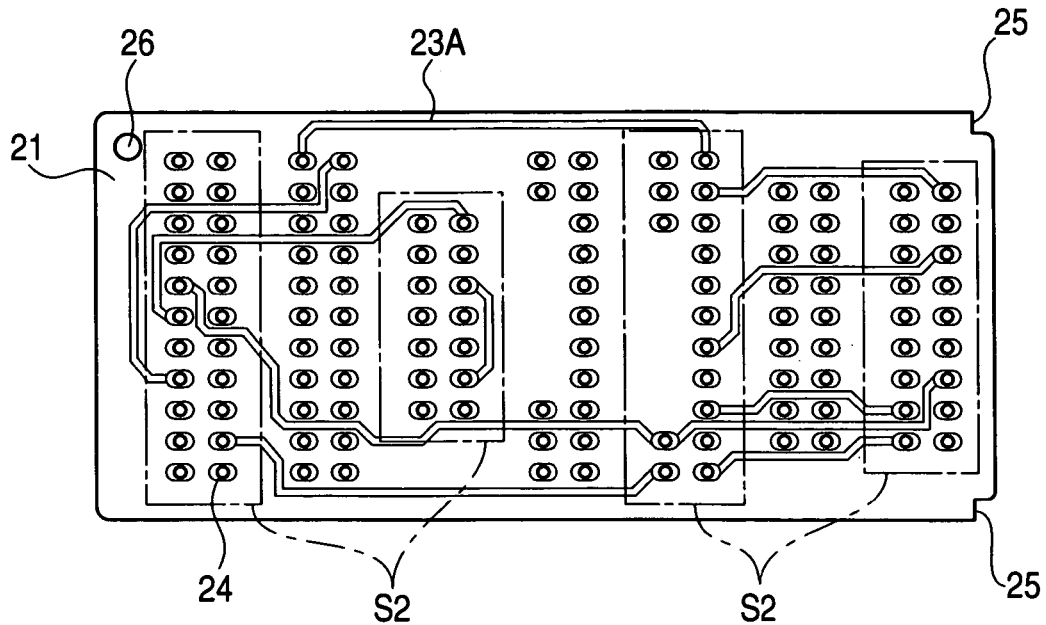
FIG. 3B is a bottom view of the printed board.

The terminals 30 of the first terminal groups 31 projecting from a front side of the rectangular-shaped board 22 are soldered to the terminal holes 24 provided in regions S1 surrounded by alternate long and short dash lines in FIG. 3A while the terminals 30 of the second terminal groups 32 projecting from a back side of the rectangular-shaped board 22 are soldered to the terminal holes 24 provided in regions S2 surrounded by alternate long and two short dashes lines in FIG. 3B.

Also, notches 25 for positioning of the printed board are provided at both corners on one of short sides of the printed board 21, and a through-hole 26 for positioning of the printed board is formed in the vicinity of a corner on the other of the short sides.

Figure 4A:
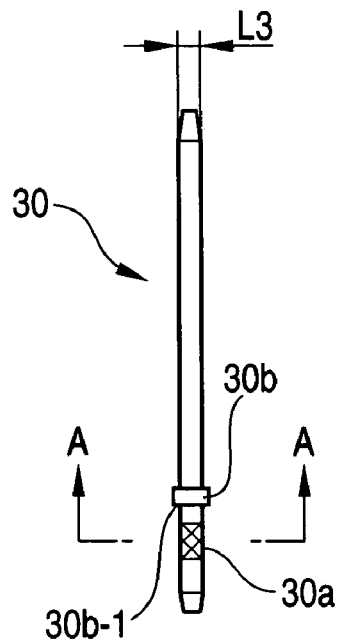
FIG. 4A is a plan view showing a terminal.
Figure 4B:
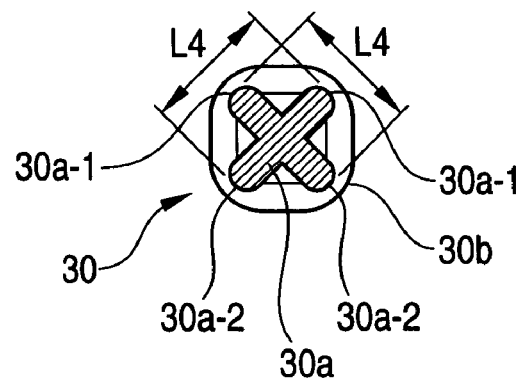
FIG. 4B is a cross sectional view taken along the line A-A of FIG. 4A.
Figure 5A:
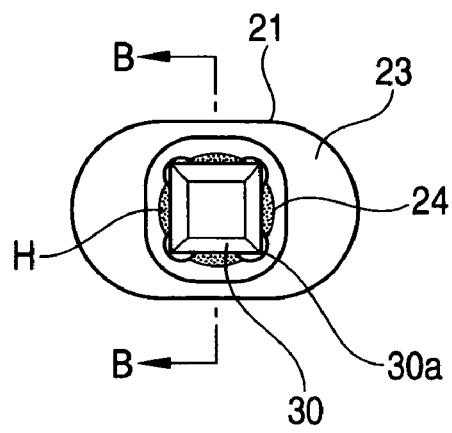
FIG. 5A is a view showing a state, in which the terminal is fitted into a terminal hole on the printed board.
Figure 5B:
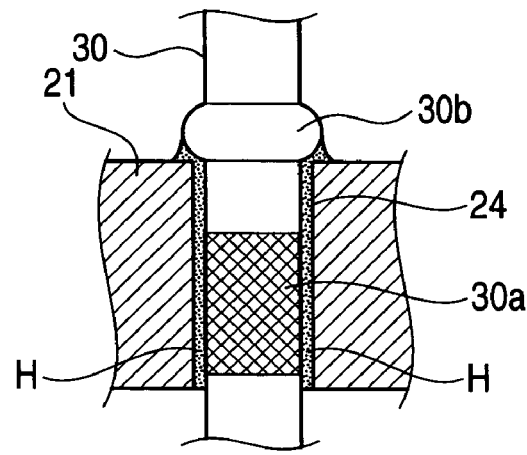
FIG. 5B is a cross sectional view taken along the line B-B of FIG. 5A.

The terminals 30 being mounted to the printed board 21 comprise a pin in the form of a square pin, of which a cross section perpendicular to an axial direction is square in shape to have one side L3 of 0.6 mm, the pin comprising a terminal press-fit part 30a provided in the vicinity of a tip end thereof on an insertion side and a large-diameter part 30b for positioning of insertion provided toward a projecting end from the terminal press-fit part 30a, as shown in FIG. 4A. The terminal press-fit part 30a has a cross section perpendicular to an axial direction of the terminal 30 to be cross in shape, and a length L4 from one end 30a-1 of the cross to the other end 30a-2 is 0.92 mm to be somewhat longer than a diameter (0.8 mm) of the terminal holes 24, as shown in FIG. 4B. The large-diameter part 30b for positioning of insertion of the terminal 30 is larger in diameter than the terminal holes 24, and the terminal 30 is inserted into the terminal hole 24 to a position, in which an insertion-side surface 30b-1 (a lower surface in FIG. 4A) of the large-diameter part 30b abuts against a peripheral edge of the terminal hole 24 of the printed board 21. At this time, both ends 30a-1, 30a-2 of the terminal press-fit part 30a bite into an inner peripheral surface of the terminal hole 24 whereby the terminal 30 is fitted into and held on the terminal hole 24 of the printed board 21. In a state, in which the terminal 30 is fitted into and held on the terminal hole 24 of the printed board 21, the terminal 30 is soldered H to the printed board 21, as shown in FIG. 5, by spot flow soldering described later to provide a terminal mounted printed board 20.

With the first terminal group 31 and the second terminal group 32 on the terminal mounted printed board 20, a pitch L1 between terminals in the same terminal group is 2 mm to 4 mm and a pitch L2 between adjacent terminals in different terminal groups is 5 mm to 10 mm. In the embodiment, the first terminal groups 31 and the second terminal groups 32 are provided at narrow pitches with L1 being 3 mm and L2 being 5.7 mm.

Connector accommodation portions 13, 14, respectively, are protrusively provided on outer surfaces of the upper casing 11 and the lower casing 12, which accommodate therein the terminal mounted printed board 20, and the connector accommodation portions 13, 14 are provided on bottom surfaces thereof with terminal holes 13a, 14a, which permit the terminals 30 of the terminal mounted printed board 20 to extend therethrough. The terminal holes 13a, 14a are square in shape to have one side of 1.44 mm and larger than an external shape of the terminals 30, which are permitted to extend therethrough. Ribs 15, 16 are protrusively provided on inner surfaces of the upper casing 11 and the lower casing 12 to surround the respective terminal holes 13a, 14a. Also, positioning projections 12a being caused to extend along the notches 25 of the printed board 21 are provided on inner surfaces of corners on one of short sides of the lower casing 12, and a positioning pin 12b being inserted through the through-hole 26 of the printed board 21 is provided in the vicinity of a corner on the other of the short sides. Further, locking pawls 11a are provided on inner surfaces of centers of respective sides of the upper casing 11 while locked pawls 12c are provided on outer surfaces of centers of respective sides of the lower casing 12.

Figure 6A:
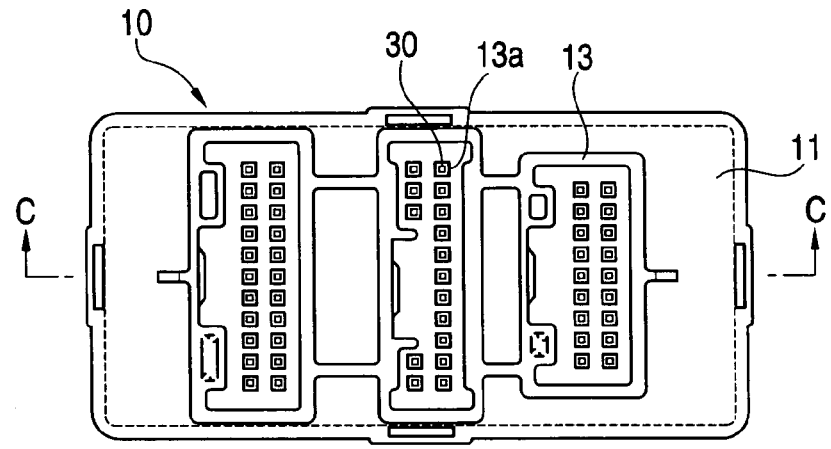
FIG. 6A is a plan view showing the electric connection box.
Figure 6B:
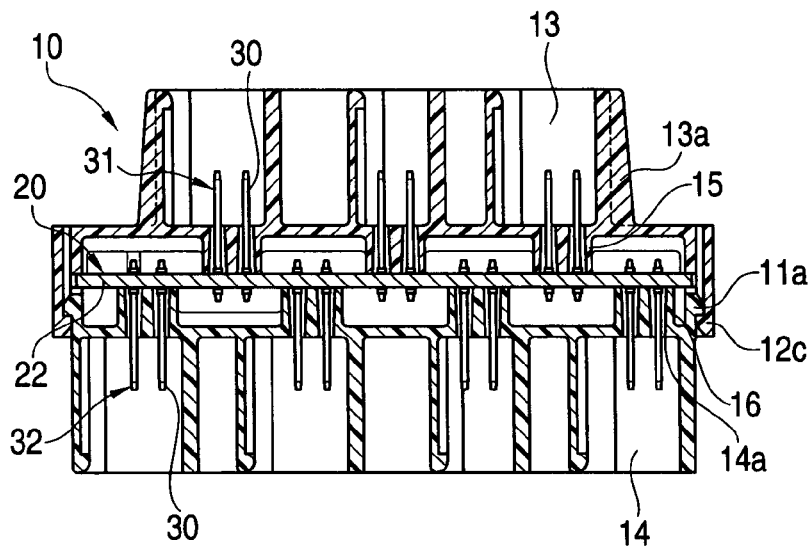
FIG. 6B is a cross sectional view taken along the line C-C of FIG. 6A.
Figure 6C:
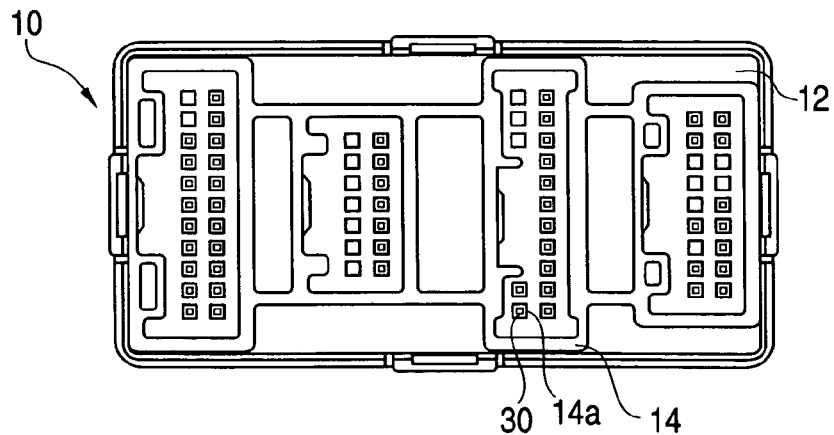
FIG. 6C is a bottom view of the electric connection box.

In a state of accommodating the terminal mounted printed board 20 in the casings, the upper casing 11 and the lower casing 12 of the electric connection box 10 lockingly join together through the locking pawls 11a of the upper casing 11 and the locked pawls 12c of the lower casing 12, as shown in FIG. 6B. The respective first terminal groups 31 of the terminal mounted printed board 20, respectively, project into the connector accommodation part 13 of the upper casing 11, the respective second terminal groups 32, respectively, project into the connector accommodation part 14 of the lower casing 12, and the respective terminal groups serve as connector terminal groups. When connectors (not shown) connected to electric-wire terminals are fitted into the respective connector accommodation portions 13, 14, male terminals in the connectors are coupled to the terminals 30 and the connectors are joined together through the terminal mounted printed board 20.

Tip ends of the ribs 15, 16 surrounding the terminal holes 13a, 14a provided in the upper casing 11 and the lower casing 12, respectively, are caused to abut against the front and back surfaces of the printed board 21.

An explanation will be given below to a method of forming the terminal mounted printed board and an electric connection box, in which the terminal mounted printed board is accommodated.

First, terminals 30 are inserted into terminal holes 24 of the rectangular-shaped board 22, on both front and back surfaces of which are provided conductors 23, from the both front and back surfaces of the rectangular-shaped board 22, and the terminals 30 are fitted into and held on the terminal holes 24 in a state, in which only soldered portions are projected toward an opposite side to a side of insertion from the terminal holes 24. The first terminal groups 31 are projected from a front side of the rectangular-shaped board 22 and the second terminal groups 32 are projected from a back side.

Figure 7A:
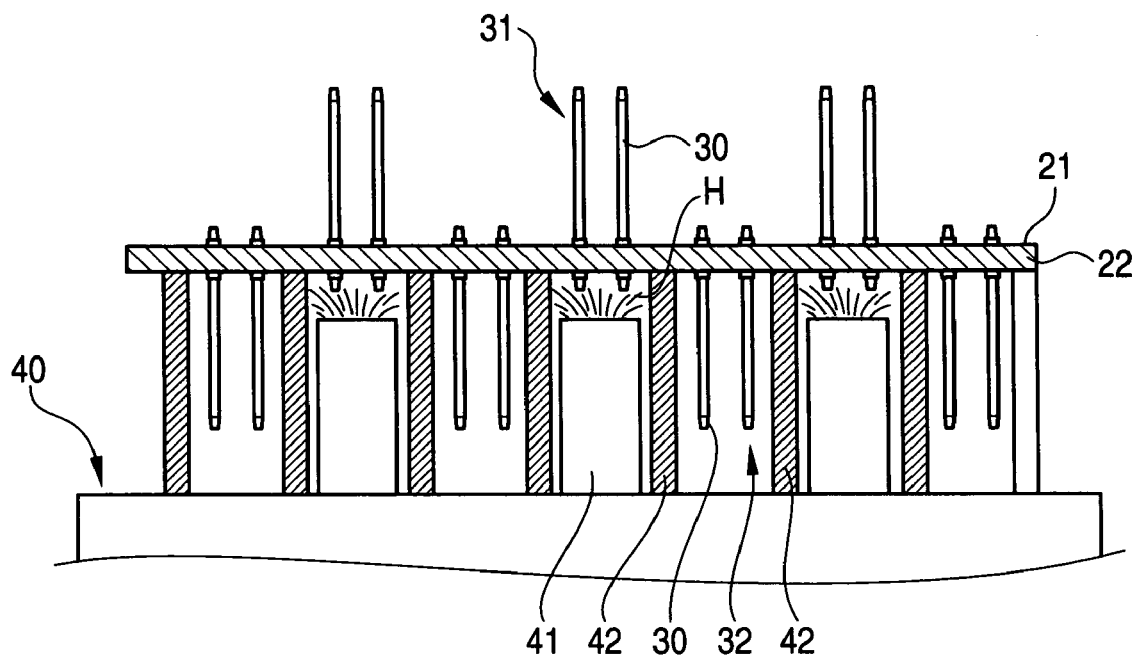
FIGS. 7A and 7B are views illustrating a method of mounting terminals on the printed board.

Subsequently, the rectangular-shaped board 22 is arranged, as shown in FIG. 7A, above solder blowing nozzles 41 of a spot flow soldering apparatus 40 with the first terminal groups 31 facing upward, and the second terminal groups 32 projected toward the solder blowing nozzles 41 are shielded by shield jigs 42. In this state, the solder blowing nozzles 41 jets solder H against the soldered portions of the first terminal groups 31 to solder the soldered portions of the first terminal groups 31 to the first conductor 23A on the back side of the rectangular-shaped board 22. At this time, the solder blowing nozzles 41 are arranged in positions opposed to all the first terminal groups 31 to jet solder H against all the first terminal groups 31 at the same time.

Figure 7B:
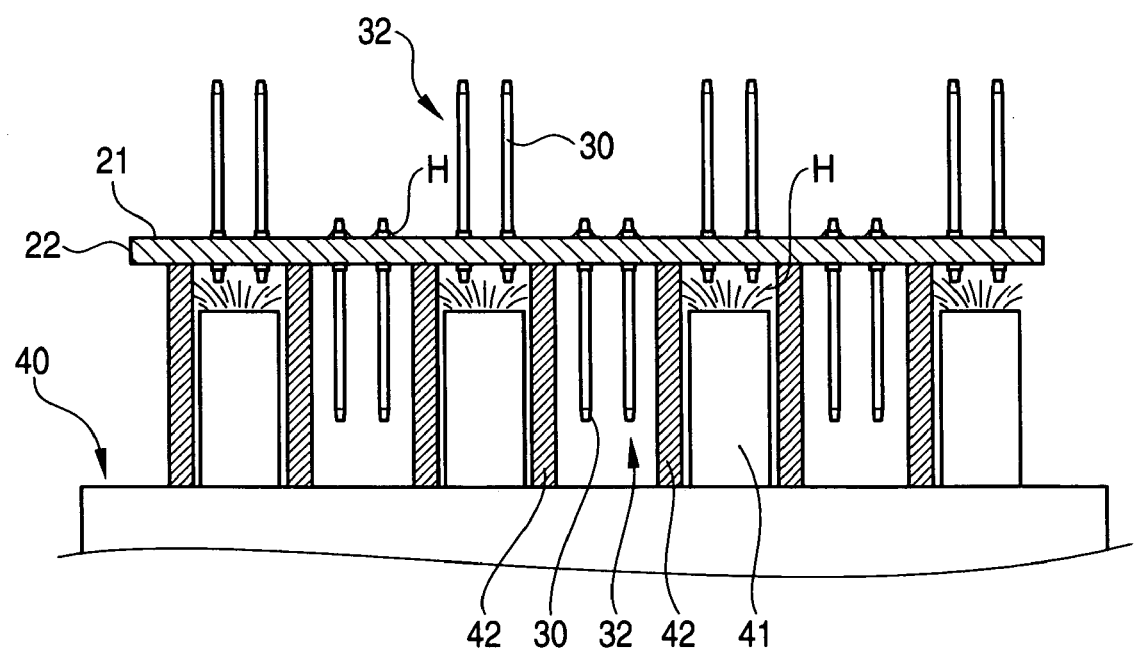

Subsequently, the rectangular-shaped board 22 is turned upside down and moved to another location on the spot flow soldering apparatus 40. This time, the rectangular-shaped board 22 is arranged, as shown in FIG. 7B, above the solder blowing nozzles 41 with the second terminal groups 32 facing upward, and the first terminal groups 31 are shielded by the shield jigs 42. In this state, the solder blowing nozzles 41 jet solder H against the soldered portions of the second terminal groups 32 to solder the soldered portions of the second terminal groups 32 to the second conductor 23B on the front side of the rectangular-shaped board 22. Also, at this time, the solder blowing nozzles 41 are arranged in positions opposed to all the second terminal groups 32 to jet solder H against all the second terminal groups 32 at the same time.

With the method described above, a terminal mounted printed board 20 is formed with the first terminal groups 31 projected from the front side of the rectangular-shaped board 22 and the second terminal groups 32 projected from the back side.

The terminal mounted printed board 20 is placed on the lower casing 12 in a state, in which the second terminal groups 32 of the terminal mounted printed board 20 formed by the method are projected into the connector accommodation portions 14 through the terminal holes 14a of the lower casing 12, the notches 25 provided at the corners of the printed board 21 are caused to extend along the projections 12a of the lower casing 12, and the pin 12b of the lower casing 12 is extended through the through-hole 26 of the rectangular-shaped board 22. Positioning effected by the notches 25 and the projections 12a and by the through-hole 26 and the pin 12b causes the terminal mounted printed board 20 to be positioned relative to the lower casing 12 and puts the respective terminals 30 of the second terminal groups 32 in a state of being inserted substantially centrally of the terminal holes 14a of the lower casing 12.

Finally, the lower casing 12 and the terminal mounted printed board 20 are covered with the upper casing 11, the first terminal groups 31 of the terminal mounted printed board 20 are passed through the terminal holes 13a of the upper casing 11 to project into the connector accommodation portions 13, and the locking pawls 11a of the upper casing 11 and the locked pawls 12c of the lower casing 12 are caused to engage with each other to lockingly join the upper casing 11 and the lower casing 12, thus forming an electric connection box 10.

With such construction, the terminals projected from the front and back sides of the rectangular-shaped board 22 are mounted by spot flow soldering, and when terminal groups projected from one side of the rectangular-shaped board 22 are subjected to soldering, terminal groups projected from the other side are projected toward the solder blowing nozzles 41 but the latter terminal groups are shielded by the shield jigs 42, so that even when the latter terminal groups are arranged in the vicinity of the solder blowing nozzles 41, solder H can be prevented from being jetted against projected portions of the terminals. Therefore, a mount work can be performed in a state, in which one of the terminal groups, against which the solder blowing nozzles 41 jet solder to achieve soldering, and the other of the terminal groups projected toward the solder blowing nozzles 41 are arranged in close positions, whereby it is possible to form a terminal mounted printed board 20, on which the first terminal groups 31 projected from the front side of the rectangular-shaped board 22 and the second terminal groups 32 projected from the back side are mounted at narrow pitches, so that the terminal mounted printed board 20 can be made small in size and high in freedom of circuit wiring.

By accommodating the terminal mounted printed board 20 as an internal circuit in the upper and lower casings and projecting the first terminal groups 31 and the second terminal groups 32 into the connector accommodation portions 13, 14 provided on the casing outer surfaces to make the same a connector terminal group, it is possible to form an electric connection box 10, which is small in size and lightweight and in which the connector accommodation portions 13, 14 are provided on both upper and lower surfaces of the casings.

Also, since the terminal holes 13a, 14a of the connector accommodation portions 13, 14 are sized to permit the terminals 30 of the terminal mounted printed board 20 to be fitted loosely thereinto, the work of insertion of the terminals 30 can be facilitated, and the terminals 30 do not abut against peripheral edges of the terminal holes 13a, 14a even when relative positions of the terminals 30 mounted to the rectangular-shaped board 22 and the terminal holes 13a, 14a are shifted by a difference in coefficient of thermal expansion (coefficient of contraction) caused by temperature changes of the upper casing 11, the lower casing 12, and the rectangular-shaped board 22. Therefore, it is possible to prevent generation of crack in solder, which would be resulted from application of pressure on soldered portions when the terminals abut against peripheral edges of the terminal holes.

Further, since the terminal holes 13a, 14a are larger in external size than the terminals 30, there are generated gaps between the terminals 30 and the terminal holes 13a, 14a but tip ends of the ribs 15 surrounding the terminal holes 13a, 14a are caused to abut against the rectangular-shaped board 22 whereby sides of the terminal holes 13a, 14a toward an interior of the casings are closed by the ribs 15 and the rectangular-shaped board 22. Therefore, it is possible to prevent foreign matters from entering into the casings from gaps between the terminal holes 13a, 14a and the terminals 30.

Figure 8:
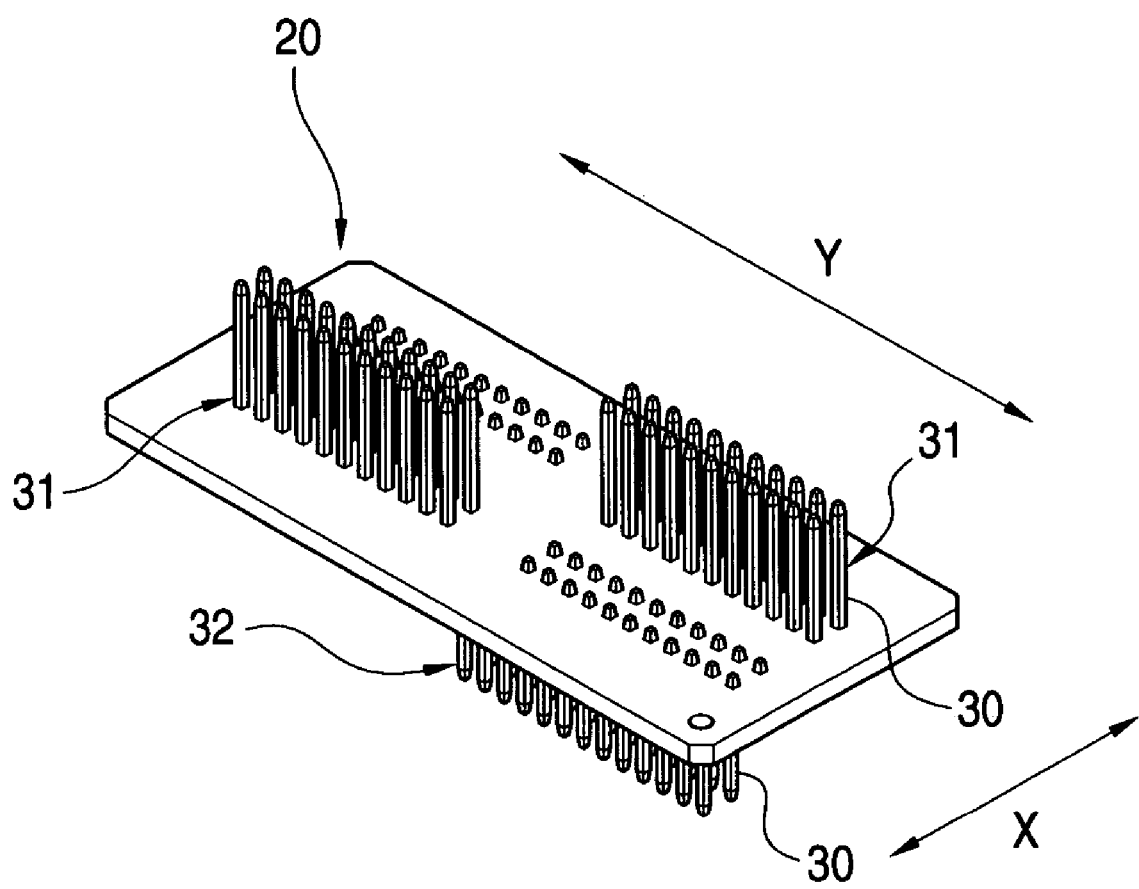
FIG. 8 is a perspective view showing a terminal mounted printed board according to a second embodiment of the invention.
Figure 9A:
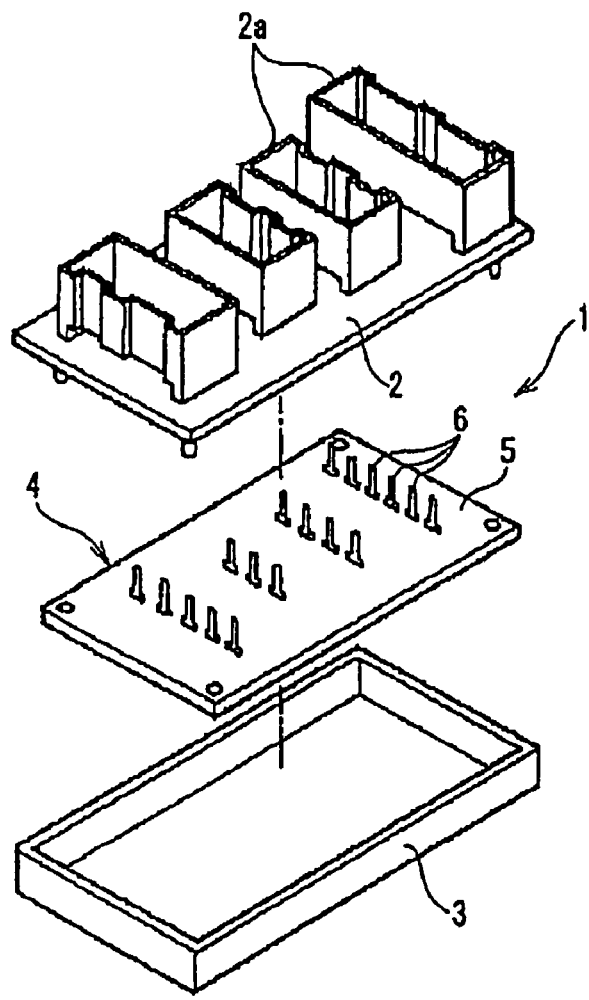
FIGS. 9A and 9B are views showing an example of related art.
Figure 9B:
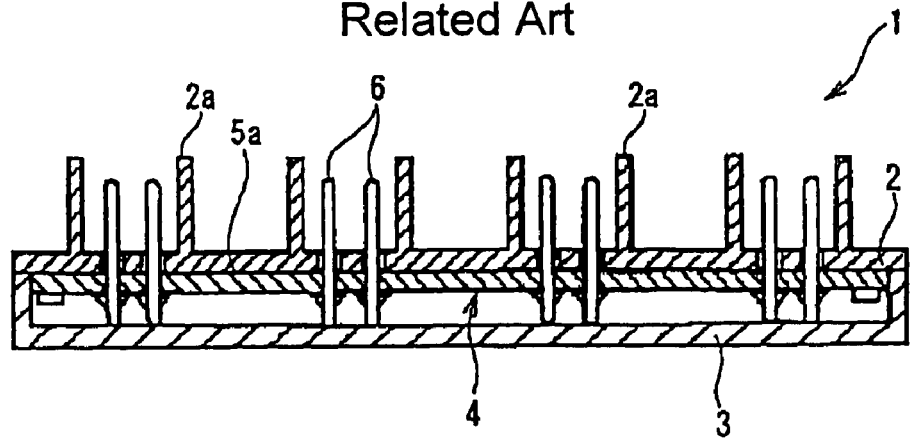
Figure 10:
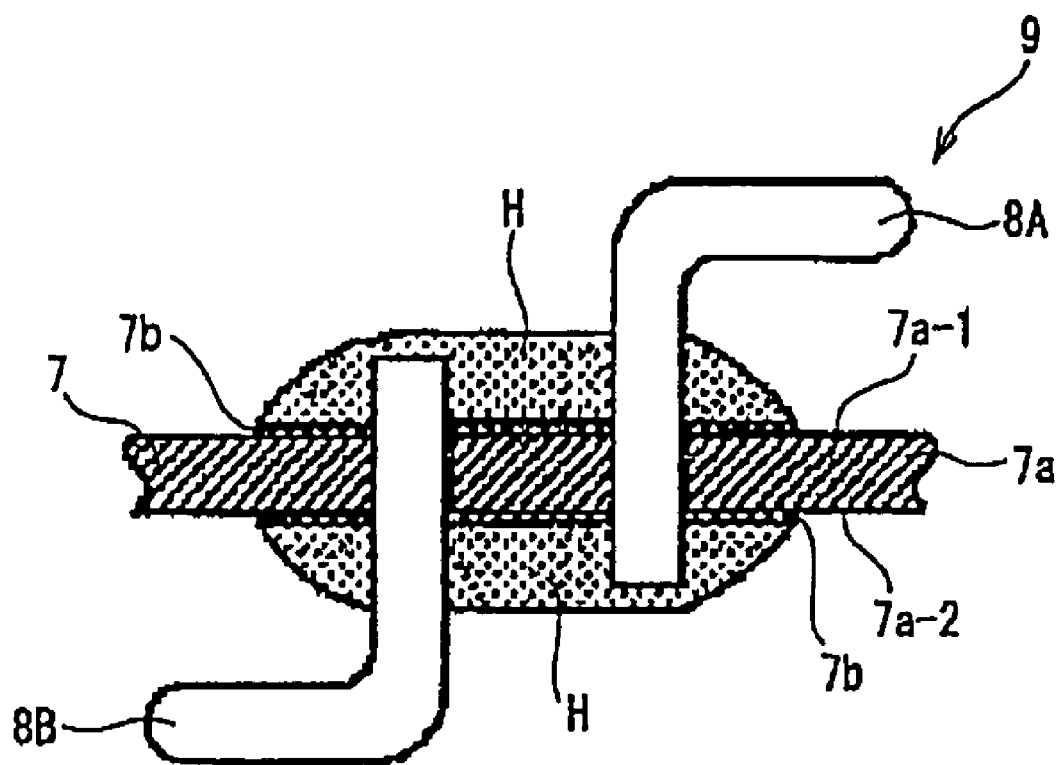
FIG. 10 is a view showing another example of related art.

FIG. 8 shows a second embodiment of the invention.

According to the embodiment, positions, in which first terminal groups 31 and second terminal groups 32 are mounted on a terminal mounted printed board 20, are made different from those in the first embodiment.

One set of terminal group is made by providing and aligning terminals 30 in two rows in a left and right, transverse direction X and in a front and rear, longitudinal direction Y, and first and second terminal groups 31, 32 are provided two sets by two sets alternately in the left and right, transverse direction X and in the front and rear, longitudinal direction Y. That is, the first terminal groups 31 and the second terminal groups 32 are mounted adjacent to each other in the left and right, transverse direction X and in the front and rear, longitudinal direction Y.

As described above, the first terminal groups 31 projected from a front side of a rectangular-shaped board 22 and the second terminal groups 32 projected from a back side can be mounted in juxtaposition not only in the left and right, transverse direction but also in the front and rear, longitudinal direction, so that it is possible to form the terminal mounted printed board 20 into a necessary shape suited to a mount space on an automobile.

In addition, since other constructions, functions, and effects are the same as those in the first embodiment, they are omitted.

What is claimed is:

1. A method of mounting a terminal on a printed board, the method comprising:
   preparing a printed board having a terminal hole and a conductor having a first conductor provided on a back side of the printed board and a second conductor provided on a front side of the printed board;
   inserting a terminal having a first terminal group and a second terminal group into the terminal hole of the printed board from the front and back sides of the printed board;
   retaining and fitting the terminal into the terminal hole of the printed board, while a soldering portion of the terminal is projected from the terminal hole;
   assembling the terminal in a state, in which the first terminal group of the terminal is projected from the front side of the printed board and the second terminal group of the terminal is projected from the back side of the printed board;
   subsequently, arranging the printed board above a solder blowing nozzle of a spot flow soldering apparatus with the first terminal group facing upward;
   shielding the second terminal group projected toward the solder blowing nozzle with a jig;
   soldering the soldered portion of the first terminal group to the first conductor provided on the back side of the printed board by solder jetted from the solder blowing nozzle;
   subsequently turning the printed board upside down to make the second group terminal face upward;
   shielding the first terminal group facing downward with the jig; and
   soldering the soldered portion of the second terminal group to the second conductor on the front side of the printed board by solder jetted from the solder blowing nozzle.

2. The method of mounting a terminal on a printed board, according to claim 1, further comprising:
   simultaneously blowing solder against the soldered portion of the first terminal group from the solder blowing nozzle of the spot flow soldering apparatus;
   turning the printed board upside down; and
   simultaneously blowing solder against the soldered portion of the second terminal group.

* * * * *